(12) United States Patent
Wu

(10) Patent No.: US 7,898,274 B2
(45) Date of Patent: Mar. 1, 2011

(54) STRUCTURE OF PROBE

(75) Inventor: Chia-Wei Wu, Taipei County (TW)

(73) Assignee: Nanya Technology Corporation, Taoyuan (TW)

( * ) Notice: Subject to any disclaimer, the term of this patent is extended or adjusted under 35 U.S.C. 154(b) by 224 days.

(21) Appl. No.: 11/745,463

(22) Filed: May 8, 2007

(65) Prior Publication Data

US 2008/0238454 A1 Oct. 2, 2008

(30) Foreign Application Priority Data

Mar. 28, 2007 (TW) .............................. 96110718 A

(51) Int. Cl.
*G01R 31/20* (2006.01)
(52) U.S. Cl. .................................. 324/754.1
(58) Field of Classification Search ................. 324/654, 324/765, 158.1, 761–762; 438/14–18; 257/48
See application file for complete search history.

(56) References Cited

U.S. PATENT DOCUMENTS

| 4,034,293 | A | * | 7/1977 | Roch | .......................... 324/762 |
| 4,599,559 | A | * | 7/1986 | Evans | .......................... 324/754 |
| 5,764,072 | A | | 6/1998 | Kister | |
| 6,667,628 | B2 | * | 12/2003 | Ahrikencheikh et al. | .... 324/754 |
| 7,180,318 | B1 | * | 2/2007 | Mahoney et al. | ............. 324/761 |

FOREIGN PATENT DOCUMENTS

| DE | 29810205 | 9/1998 |
| DE | 10059475 | 6/2001 |
| JP | 01-209380 | 8/1989 |
| JP | 02-222156 | 9/1990 |
| JP | 03-048170 | 3/1991 |
| JP | 2001-153885 | 6/2001 |
| JP | 2006-208235 | 8/2006 |
| TW | 200305021 | 10/2003 |
| TW | M254599 | 1/2005 |

OTHER PUBLICATIONS

"Office Action of Taiwan counterpart application", issued on Dec. 7, 2009, p. 1-p. 5.
"Office Action of Japan Counterpart Application" issued on Feb. 23, 2010, p. 1-p. 3.

* cited by examiner

*Primary Examiner*—Ha Tran T Nguyen
*Assistant Examiner*—Tung X Nguyen
(74) *Attorney, Agent, or Firm*—Jianq Chyun IP Office

(57) ABSTRACT

A split-type probe is used to contact with an object under test to detect an electrical characteristic thereof. The probe provided by the present invention has a contact head used to contact with the object under test, and a first needle body and a second needle body. The first needle body is connected to the contact head to transmit a testing signal to the object under test for performing detection. In addition, the second needle body is also connected to the contact head to transmit a response signal generated by the object under test due to the testing signal to obtain the electrical characteristic of the object under test.

3 Claims, 6 Drawing Sheets

STRUCTURE OF PROBE

CROSS-REFERENCE TO RELATED APPLICATION

This application claims the priority benefit of Taiwan application serial no. 96110718, filed Mar. 28, 2007. All disclosure of the Taiwan application is incorporated herein by reference.

BACKGROUND OF THE INVENTION

1. Field of the Invention

The present invention relates to a probe structure. More particularly, the present invention relates to a split-type probe.

2. Description of Related Art

A semiconductor package test can be mainly divided into two parts, namely, wafer probe and sort after wafer processing, and final test after packaging. In the wafer probe and sort, a probe of a wafer probe card on a wafer prober is used to connect to a pad of each of dies on a wafer under test. Then, data measured are transmitted to a tester for making analysis and determination to obtain repairable data of each die. According to the repairable data, a test man can use a laser-repair machine to replace defect elements, and it is finished after passing the test.

FIG. 1 is a structural view of a conventional wafer probe card. Referring to FIG. 1, a conventional wafer probe card 100 includes probes 102, 114, 116, and a circuit board 104. According to a current technique, the circuit board 104 usually adopts a fly-by structure, that is, signal transmission lines 106, 108 connected to each other by a connecting plug 110 are respectively disposed on two surfaces of the circuit board 104.

In the conventional art, one end of the probe 102 is connected to the connecting plug 110, and another end is used to contact with dies of a wafer under test (not shown). In addition, one end of the probe 114 and one end of the probe 116 are grounded or connected to a common voltage through connecting plugs 122 and 124, and another end of the probe 114 and another end of the probe 116 are used to contact with the object under test.

In the conventional wafer probe card 100, the test end generates a testing signal to the signal transmission line 106 of the circuit board 104, and transmits the testing signal to the wafer under test through the probe 102, such that the object under test generates a response signal. In addition, the probe 102 can receive the response signal generated by the object under test, and transmits the response signal to the test end through the signal transmission line 108, so as to obtain the electrical characteristic of the object under test.

FIG. 2A is a waveform diagram of the voltage vs. the time of the testing signal during transmission according to the conventional art. Referring to FIG. 2A, the longitudinal axis is the voltage, and the horizontal axis is the time. In addition, the waveform 201 is the waveform of the testing signal measured at the circuit board end, and the waveform 203 is the waveform of the testing signal measured at the contact end of the probe. As shown in FIG. 2A, when the circuit board transmits a testing signal to the object under test through the probe, the signal attenuation amount is limited.

FIG. 2B is a waveform diagram of the voltage vs. the time of the response signal during transmission according to the conventional art. Referring to FIG. 2B, similarly, the longitudinal axis is the voltage, and the horizontal axis is the time. In addition, the waveform 211 is the waveform of the response signal measured at the contact end of the probe, and the waveform 213 is the waveform of the response signal measured at the circuit board end. As shown in FIG. 2B, the maximum voltage of the response signal at the contact end, e.g. A point, is approximately 750 mV. When the response signal is transmitted back to the circuit board by the probe, the maximum voltage, e.g. B point, is approximately 500 mV. High signal attenuation results in the error of the test end when performing determination, and the signal attenuation is more distinct during high-speed signal transmission. The object under test can be a semiconductor device or each die on the wafer.

SUMMARY OF THE INVENTION

Accordingly, the present invention provides a split-type probe for a tester, so as to reduce the attenuation of a signal resulted during transmission.

In addition, the present invention also provides a tester with low signal attenuation, capable of accurately measuring the electrical characteristic of the object under test.

The split-type probe provided by the present invention for contacting with an object under test, so as to detect the electrical characteristic. The probe has a contact head used to contact with the object under test, and has a first needle body and a second needle body. In the embodiment of the present invention, the first needle body and the contact head are connected with each other, so as to transmit a testing signal to the object under test for performing detection. In addition, the second needle body is also connected to the contact head, for transmitting a response signal generated by the object under test due to the testing signal.

From another aspect, the present invention provides a split-type probe, characterized in that the probe of the present invention has a contact end, a first signal end, and a second signal end. In the embodiment of the present invention, the probe receives a testing signal from the first signal end, and transmits the testing signal from the contact end to an object under test, such that the object under test generates a response signal. In addition, the probe uses the contact head to receive the response signal, and transmits back the response signal from the second signal end, so as to detect the electrical characteristic of the object under test.

From another aspect, the present invention provides a tester with low signal attenuation, for measuring the electrical characteristic of an object under test. The tester of the present invention includes a circuit board having a first surface and a second surface. A first signal transmission line and a second signal transmission line are respectively disposed on the first surface and the second surface. In addition, the present invention also has a probe having a contact end for contacting with the object under test, and a first signal end and a second signal end respectively connected to the first signal transmission line and the second signal transmission line. In the embodiment of the present invention, the probe receives a testing signal from the first signal transmission line through the first signal end, and transmits the testing signal to the object under test through the contact end, so as to make the object under test to generate a response signal. In addition, the probe receives the response signal through the contact end, and transmits the response signal to the second signal transmission line through the second signal end, so as to measure the electrical characteristic of the object under test.

In the present invention, the testing signal and the response signal are transmitted on different needle bodies, so the probe provided by the present invention has a lower signal attenuation, such that the detecting apparatus provided by the present invention can accurately measure the electrical characteristic of the object under test.

In order to make the aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
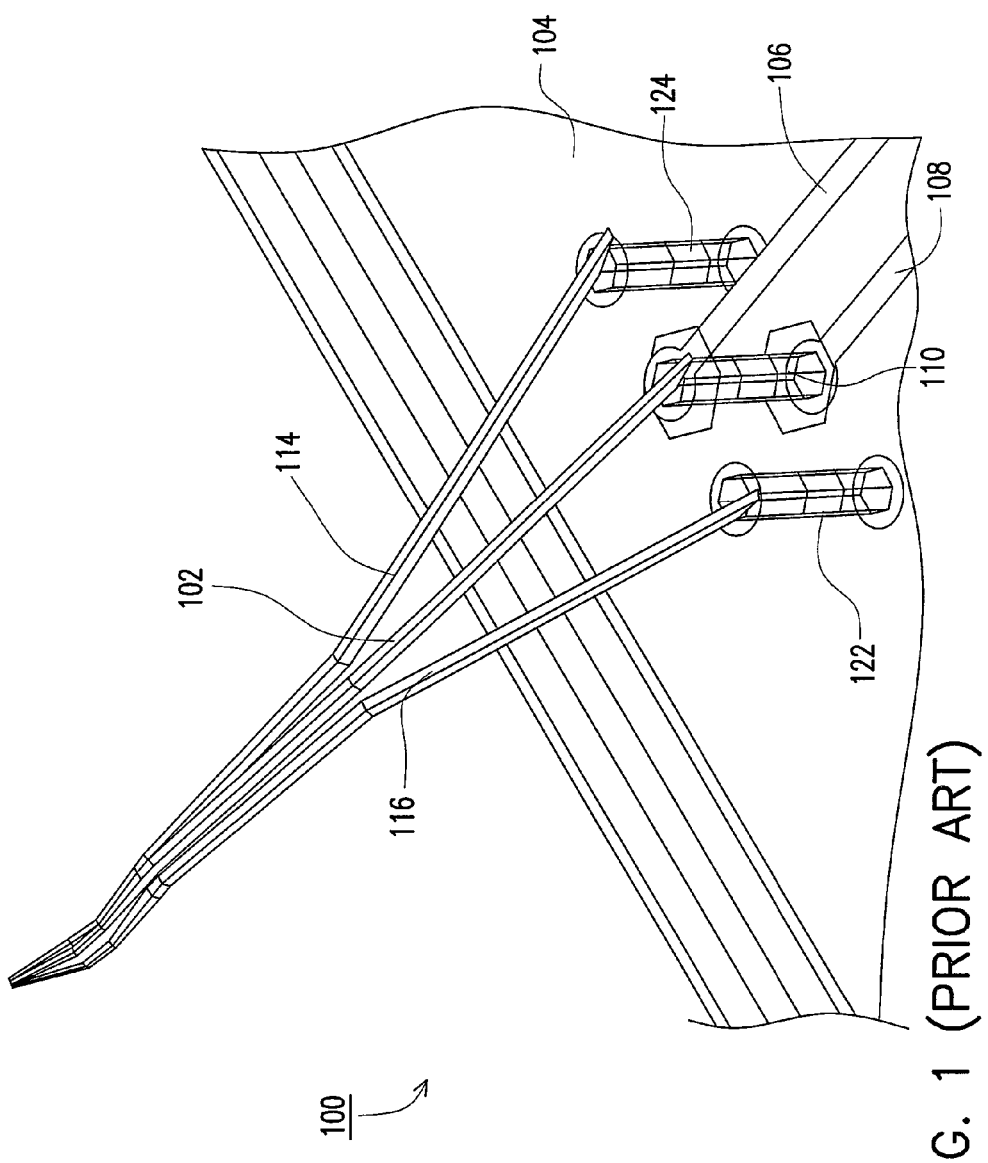
FIG. 1 is a structural view of a conventional wafer probe card.
Figure 2A:
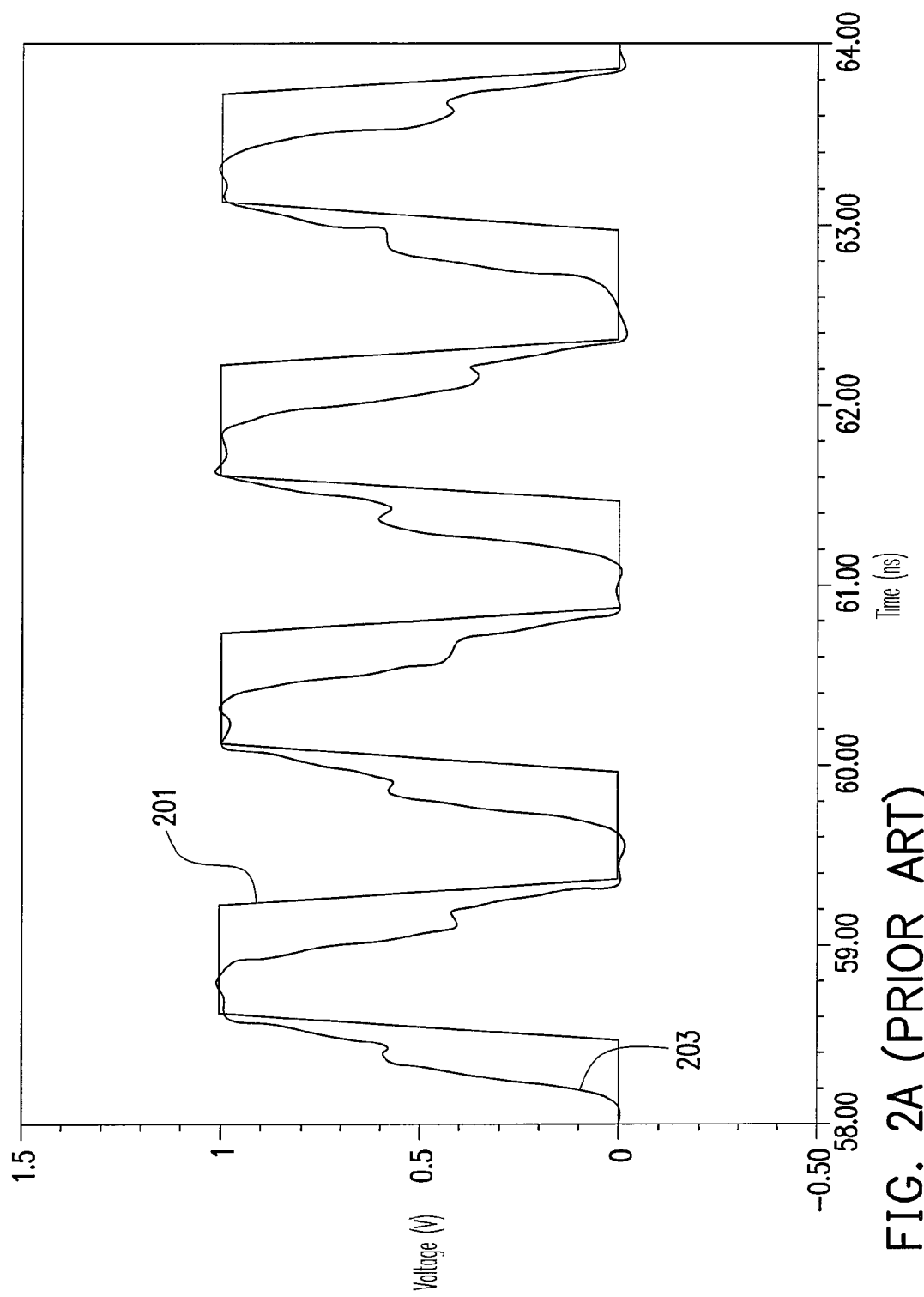
FIG. 2A is a waveform diagram of the voltage vs. the time of the testing signal during transmission according to the conventional art.
Figure 2B:
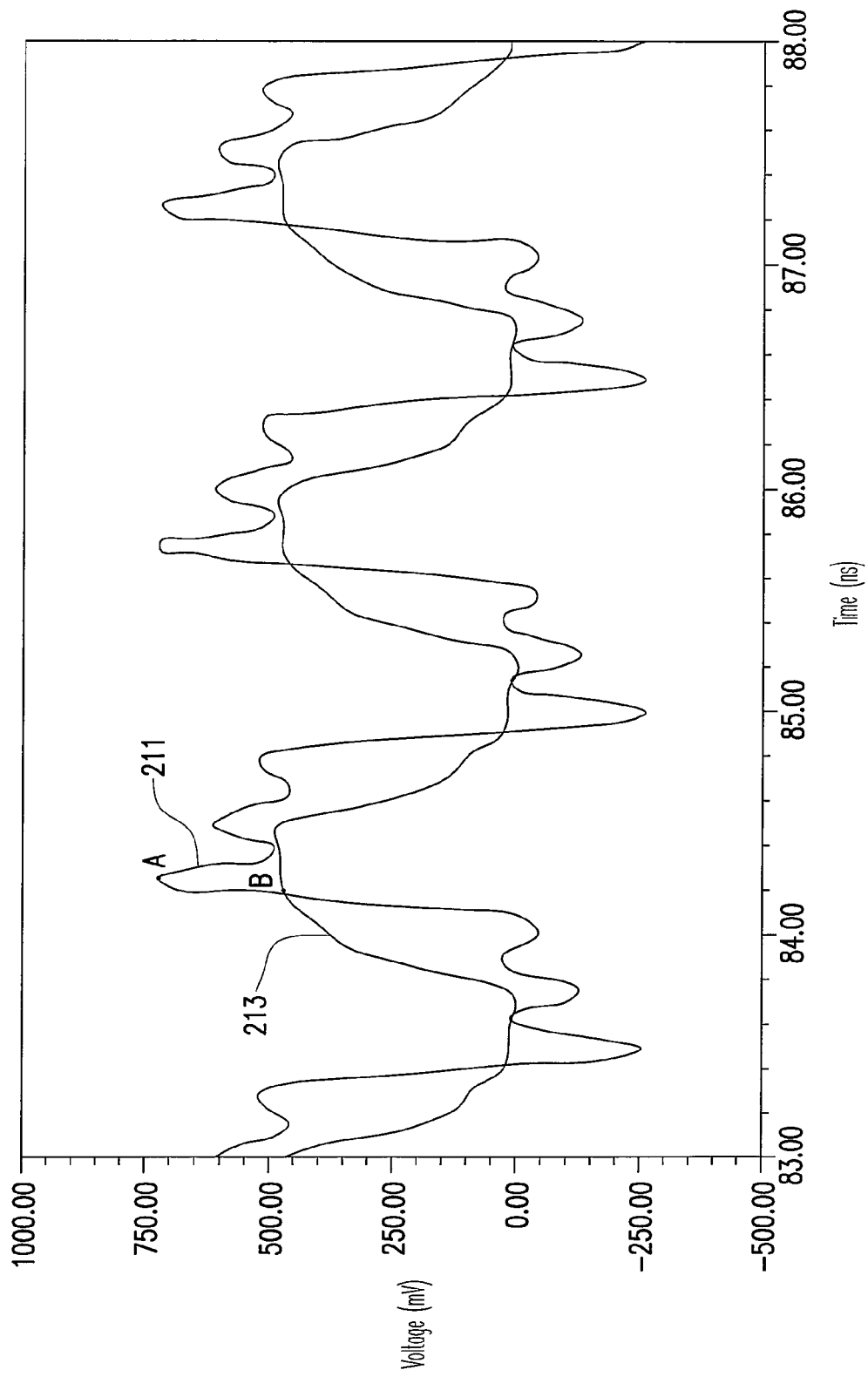
FIG. 2B is a waveform diagram of the voltage vs. the time of the response signal during transmission according to the conventional art.
Figure 3A:
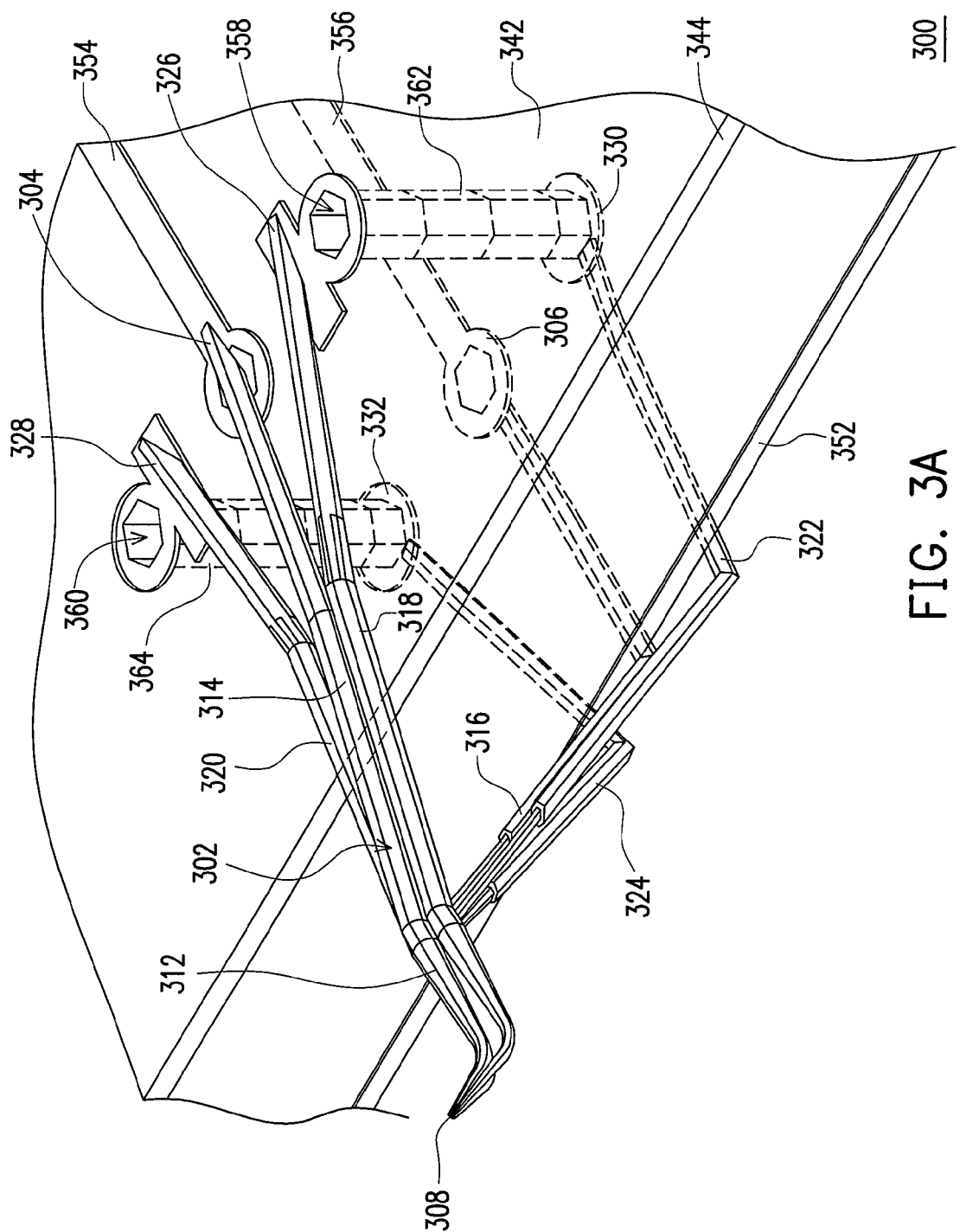
FIG. 3A is a perspective structural view of a tester according to a preferred embodiment of the present invention.
Figure 3B:
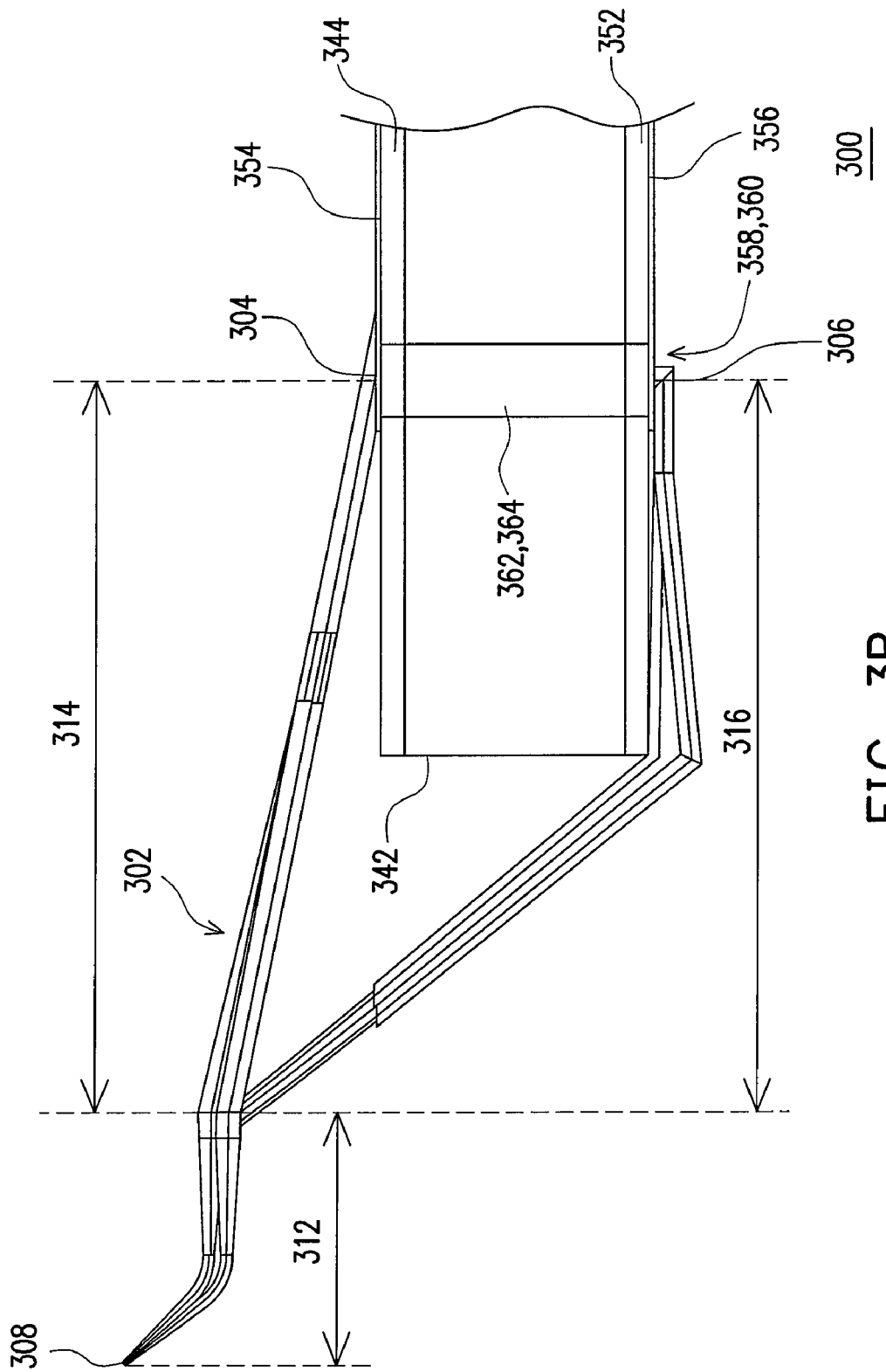
FIG. 3B is a side view of a tester according to a preferred embodiment of the present invention.

FIG. 3A is perspective structural view of a tester according to a preferred embodiment of the present invention, and FIG. 3B is a side view of a tester according to a preferred embodiment of the present invention. Referring to FIGS. 3A and 3B, the tester 300 provided by the present invention includes a probe 302 and a circuit board 342. Particularly, the probe 302 provided by the present invention has a first signal end 304, a second signal end 306, and a contact end 308. In this embodiment, the first signal end 304 and the second signal end 306 are respectively connected to the circuit board 342, and the contact end 308 of the probe 302 is used to contact with the object under test, such as the semiconductor device or a plurality of dies on the wafer.

Generally speaking, the material of the probe 302 can be tungsten steel, BeCu, or palladium alloy. In this embodiment, the probe 302 at least has a contact head 312, a first needle body 314, and a second needle body 316. One end of the contact head 312 is used as the contact end 308, and another end is connected to the first needle body 314 and the second needle body 316. In addition, one of ends of the first needle body 314 and one end of the second needle body 316 are connected to one end of the contact head 312 together, and another one of ends of the first needle body 314 and another end of the second needle body 316 are respectively the first signal end 304 and the second signal end 306.

Generally speaking, the tester 300 provided by the present invention also includes probes 318 and 320 respectively disposed at two sides of the probe 302. In this embodiment, one end of the probe 318 and one end of the probe 320 are used to contact with the object under test, and another end of the probe 318 and another end of the probe 320 are respectively a third signal end 326 and a fourth signal end 328, for electrically connecting to a common voltage or grounding.

In consideration of structural stress balance, in some selected embodiments, the tester 300 of the present invention also includes a probe 322 and a probe 324 which are located at two sides of the second needle body 316. One end of the probe 322 and one end of the probe 324 are respectively connected to probes 318 and 320 to contact with the object under test, and another end of the probe 322 and another end of the probe 324 are respectively a fifth signal end 330 and a sixth signal end 332 for electrically connecting to a common voltage together or grounding with the third signal end 326 and the fourth signal end 328.

Referring to FIGS. 3A and 3B, the circuit board 342 also includes a first surface 344 and a second surface 352. In addition, the circuit board 342 in this embodiment can also have a plurality of through holes, for example through holes 358 and 360 exposed at the first surface 344 and the second surface 352. In addition, connecting plugs 362 and 364 are respectively disposed in the through holes 358 and 360. Whereby, the third signal end 326, the fourth signal end 328, the fifth signal end 330, and the sixth signal end 332 can be respectively connected to a common voltage or grounded through the connecting plugs 362 and 364.

In this embodiment, the circuit board 342 can be a fly-by structure. That is, a first signal transmission line 354 and a second signal transmission line 356 are respectively disposed on the first surface 344 and the second surface 352, and are respectively connected to the first signal end 304 and the second signal end 306 of the probe 302. Generally speaking, the first signal transmission line 354 and the second transmission line 356 can be copper foil line.

When the tester is used to measure the electrical characteristic of an object under test (not shown), the contact end 308 of the probe 302 contacts with the object under test, so as to generate a testing signal which is transmitted to the probe 302 through the first signal transmission line 354. At this time, the probe 302 receives the testing signal from the first signal end 304, and transmits the testing signal from the contact end 308 to the object under test through the first needle body 314 and the contact head 312.

When the object under test such as the wafer receives the testing signal, a response signal is generated. At this time, the probe 302 receives the response signal from the contact end 308, and transmits the response signal from the second signal end 306 to the second signal transmission line 356 of the second surface 352 of the circuit board 342 through the contact head 312 and the second needle body 316. Whereby, the test end can measure the electrical characteristic of the object under test according to the response signal.

Figure 4:
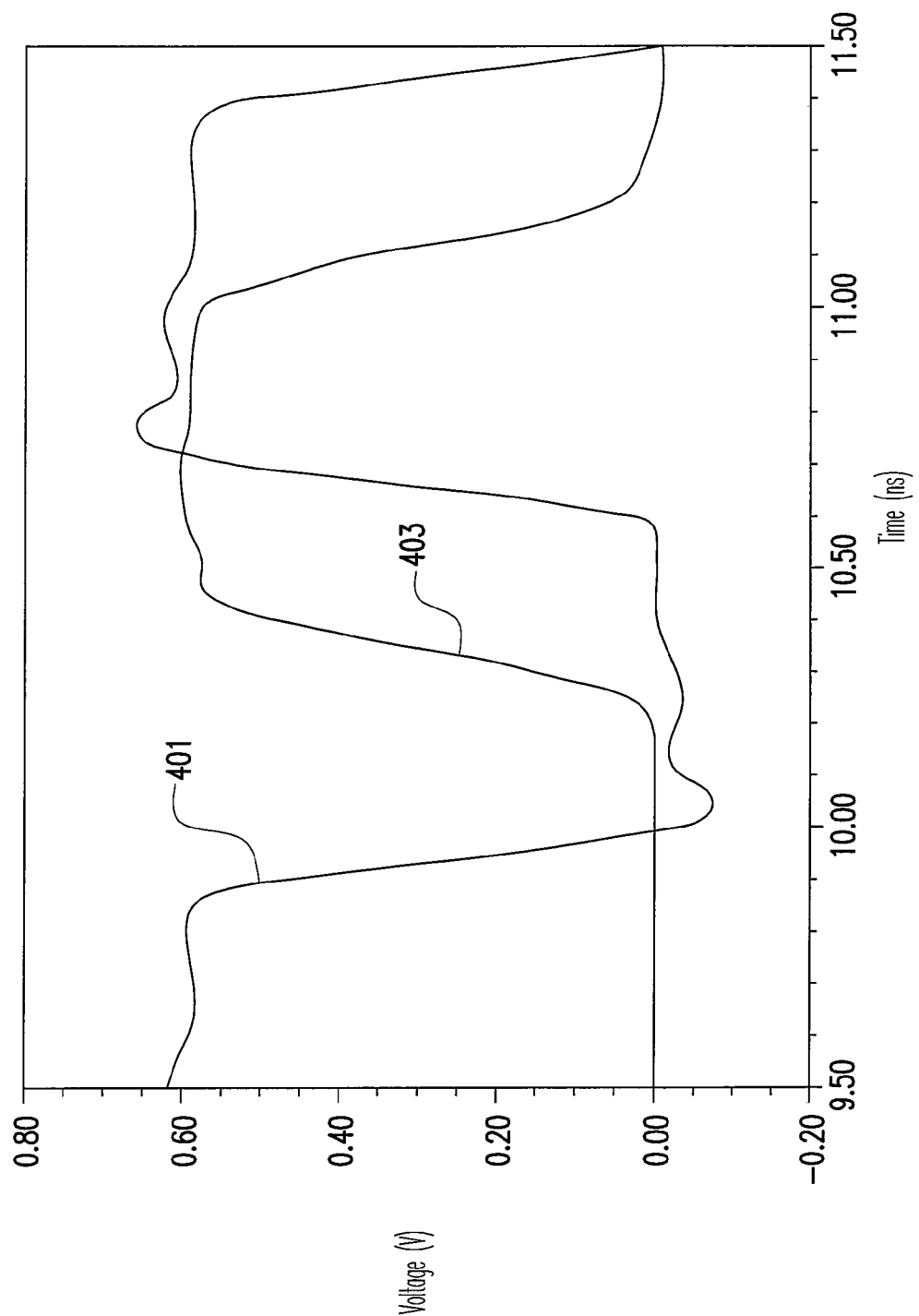
FIG. 4 is a waveform diagram of the voltage vs. the time measured when the response signal is transmitted through the split-type probe of the present invention.

FIG. 4 is a waveform diagram of the voltage vs. the time measured when the response signal is transmitted through the split-type probe of the present invention. The longitudinal axis is the voltage, and the horizontal axis is the time. In addition, the waveform 401 is the waveform of the response signal measured at the contact end of the probe, and the waveform 403 is the waveform of the response signal measured at the circuit board end. In the present invention, the transmission paths of the testing signal and the response signal in the probe are partially overlapped at the contact head, and most of the remaining transmission paths are split. Therefore, as shown in FIG. 4, the difference between the maximum value of the waveform of the response signal measured at the contact end and the maximum value of the waveform of the response signal measured at the circuit board end is merely about 50 mV. Therefore, the split-type probe provided by the present invention can be used to effectively overcome the problem of attenuation resulted during the transmission of the signal.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A split-type probe, suitable for contacting with an object under test to detect an electrical characteristic of the object under test, comprising:
    a contact head, for contacting with the object under test;
    multiple first needle bodies, extending from the contact head jointly for engagement with the object so as to transmit a testing signal to the object; and
    multiple second needle bodies, extending from the contact head jointly for engagement with the object so as to transmit a response signal corresponding to the testing signal from the first needle bodies; and
    a circuit board, sandwiched between the first needle bodies and the second needle bodies, and partially separating the first needle bodies from the second needle bodies.

2. The split-type probe as claimed in claim 1, wherein the material of the contact head, the first needle bodies, and the second needle bodies comprises tungsten steel, BeCu, or palladium alloy.

3. The split-type probe as claimed in claim 1, wherein the object under test comprises a semiconductor device or a plurality of dies on a wafer.

* * * * *